United States Patent
Uemura et al.

(10) Patent No.: US 8,389,304 B2
(45) Date of Patent: Mar. 5, 2013

(54) METHOD FOR PRODUCING GROUP III NITRIDE SEMICONDUCTOR LIGHT-EMITTING DEVICE

(75) Inventors: Toshiya Uemura, Kiyosu (JP); Jun Ito, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 117 days.

(21) Appl. No.: 13/067,142

(22) Filed: May 11, 2011

(65) Prior Publication Data

US 2011/0281381 A1    Nov. 17, 2011

(30) Foreign Application Priority Data

May 14, 2010 (JP) ................................. 2010-111947

(51) Int. Cl.
*H01L 21/00* (2006.01)
(52) U.S. Cl. ..................... 438/22; 438/47; 257/E21.527
(58) Field of Classification Search .................. 438/22, 438/29, 46, 47; 257/E21.527
See application file for complete search history.

(56) References Cited

U.S. PATENT DOCUMENTS 6,429,032 B1 * 8/2002 Okuyama et al. ............... 438/22

FOREIGN PATENT DOCUMENTS

| JP | 2003-092426 A | 3/2003 |
| JP | 2008-130606 A | 6/2008 |

* cited by examiner

*Primary Examiner* — Hoai V Pham
(74) *Attorney, Agent, or Firm* — McGinn IP Law Group, PLLC

(57) ABSTRACT

The present invention provides a method for producing a Group III nitride semiconductor light-emitting device, the device including a light-emitting layer which is formed so as to contour a stripe-pattern embossment and to have a uniform thickness. In the production method, firstly, a stripe-pattern embossment having a serrated cross section is formed on one surface of a substrate. Subsequently, on the surface of the substrate on the side of the stripe-pattern embossment having a serrated cross section, an n-type layer, a light-emitting layer, and a p-type layer are sequentially deposited through reduced-pressure MOCVD so as to contour the embossment. Thus, each of the layers is formed so as to contour the embossment, and to have a stripe pattern with a serrated cross section. In this MOCVD process, the direction of gas flow is parallel with the direction of the stripe of the embossment. Thus, the light-emitting layer has uniform thickness and composition in an in-plane direction.

15 Claims, 2 Drawing Sheets

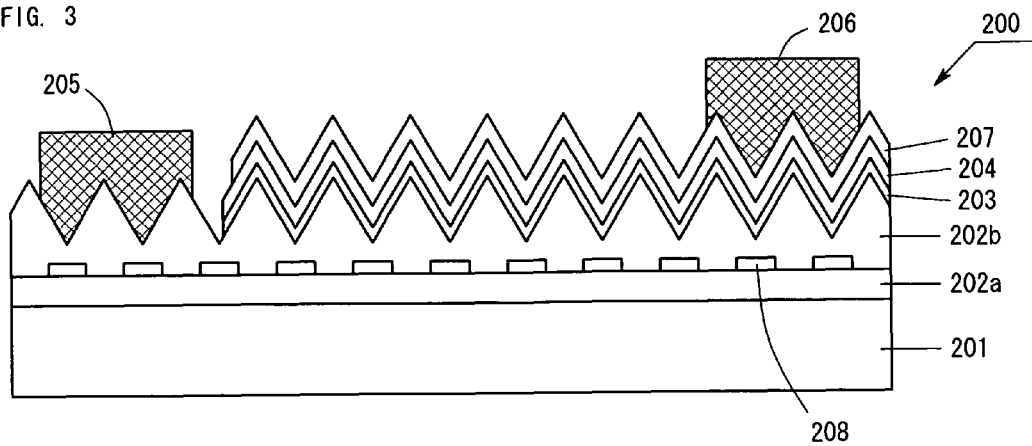
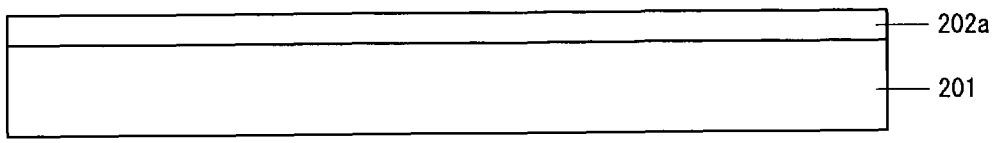
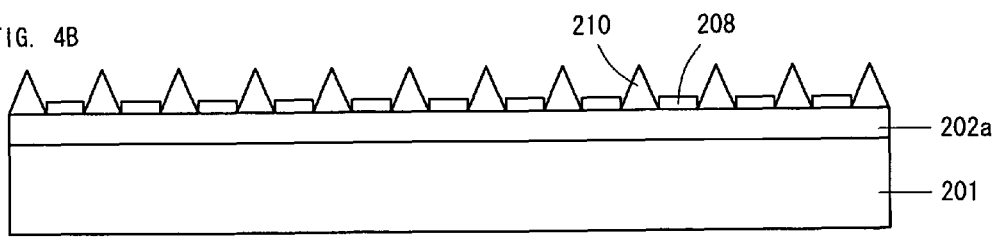
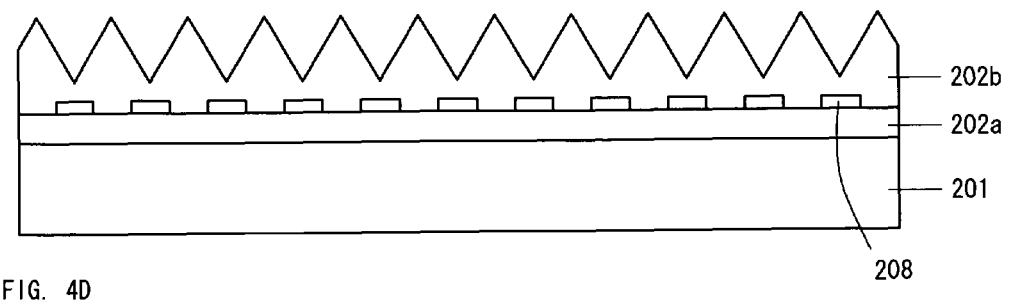
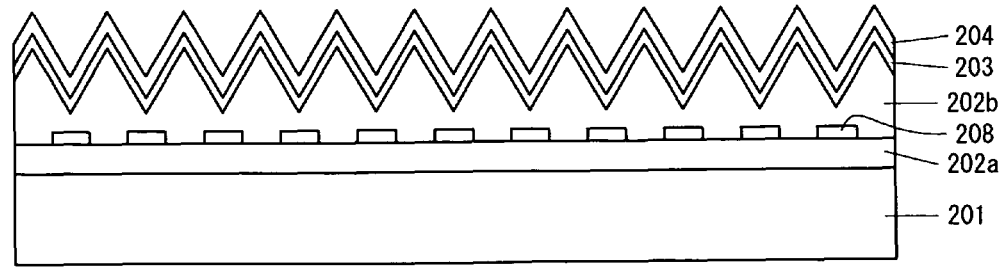

METHOD FOR PRODUCING GROUP III NITRIDE SEMICONDUCTOR LIGHT-EMITTING DEVICE

BACKGROUND OF THE INVENTION

1. Field of the Invention

The present invention relates to a method for producing a Group III nitride semiconductor light-emitting device including an n-type layer having thereon an embossment in which dents and mesas are arranged in a stripe pattern as viewed from above (hereinafter such an embossment may be referred to simply as a "stripe-pattern embossment"), and a light-emitting layer which is deposited on the n-type layer so as to contour the embossment.

2. Background Art

Widely used Group III nitride semiconductor light-emitting devices have a structure including a sapphire substrate, and a Group III nitride semiconductor layer having a c-plane main surface and deposited on the substrate. In a Group III nitride semiconductor light-emitting device having such a structure, internal quantum efficiency is approaching its limit, and difficulty is encountered in greatly improving light output. Although many studies have been conducted on the electrode of such a device or the shape of chip, difficulty is encountered in greatly improving light extraction performance.

Japanese Patent Application Laid-Open (kokai) No. 2003-92426 or 2008-130606 proposes a technique for solving such a problem. Specifically, Japanese Patent Application Laid-Open (kokai) No. 2003-92426 or 2008-130606 discloses a method for producing a semiconductor device having an increased emission area and exhibiting improved light output by forming, on an embossed n-type layer, an undulated light-emitting layer so as to contour the embossment. Japanese Patent Application Laid-Open (kokai) No. 2008-130606 also discloses a semiconductor layer having a stripe-pattern embossment and a serrated cross section, in which inclined surfaces forming the embossment are m-plane surfaces (i.e., non-polar plane surfaces). Since m-plane is a plane which provides a piezoelectric field of zero, internal quantum efficiency can be improved.

However, when an undulated light-emitting layer is formed so as to contour the embossment of an n-type layer as described in Japanese Patent Application Laid-Open (kokai) No. 2003-92426 or 2008-130606, the light-emitting layer may exhibit a variation in thickness; i.e., difficulty is encountered in forming the light-emitting layer to have a uniform thickness.

SUMMARY OF THE INVENTION

In view of the foregoing, an object of the present invention is to provide a method for producing a Group III nitride semiconductor light-emitting device, the device comprising an n-type layer having an embossment on a surface thereof, and a light-emitting layer which is formed so as to contour the embossment and to have a uniform thickness.

In a first aspect of the present invention, there is provided a method for producing a Group III nitride semiconductor light-emitting device, the method comprising forming an n-type layer from a Group III nitride semiconductor so as to have a stripe-pattern embossment on a surface thereof; and forming, through MOCVD, a light-emitting layer from a Group III nitride semiconductor on the embossed surface of the n-type layer so as to contour the embossment, wherein the light-emitting layer is formed by causing a raw material gas to flow in a direction parallel with the direction of the stripe.

As used herein, "Group III nitride semiconductor" encompasses a semiconductor represented by the formula $Al_xGa_yIn_zN$ ($x+y+z=1$, $0 \leq x, y, z \leq 1$); such a semiconductor in which a portion of Al, Ga, or In is substituted by another Group 13 element (i.e., B or Tl), or a portion of N is substituted by another Group 15 element (i.e., P, As, Sb, or Bi). Specific examples of the Group III nitride semiconductor include those containing at least Ga, such as GaN, InGaN, AlGaN, and AlGaInN. Generally, Si is used as an n-type impurity, and Mg is used as a p-type impurity.

The direction of flow of the raw material gas is not necessarily completely identical to a direction parallel with the direction of the stripe. The direction of flow of the raw material gas may be deflected from the direction of the stripe, so long as the flow direction is not orthogonal to the stripe direction. When the direction of gas flow is deflected so as to include the direction orthogonal to the stripe direction, disturbed flow may occur in the vicinity of the surface of a semiconductor crystal, resulting in an increase in non-uniformity of the thickness or composition of the light-emitting layer. Preferably, the angle of deflection of gas flow falls within a range of −30° to 30° with respect to the stripe direction. When the deflection angle falls within the above range, the resultant light-emitting layer has more uniform thickness and composition.

The stripe-pattern embossment preferably has such a shape that the area of surfaces parallel with the main surface of the n-type layer is as small as possible, from the viewpoint of an increase in emission area. Particularly preferably, the embossment has such a shape that it does not have surfaces parallel with the main surface of the n-type layer; i.e., the embossment has a serrated cross section in a direction perpendicular to the stripe direction. More preferably, inclined surfaces forming the embossment having such a serrated cross section are (11-22)-plane surfaces. Since (11-22) plane is inclined by about 60° with respect to c-plane and is a semi-polar plane, internal quantum efficiency can be improved.

The n-type layer may be undulated so as to contour the embossment. Alternatively, the embossment may be provided only on the surface of the n-type layer on the side of the light-emitting layer. A p-type layer formed on the light-emitting layer may be undulated so as to contour the embossment, as in the case of the light-emitting layer. Alternatively, the surface of the p-type layer on the side opposite the side of the light-emitting layer may be a flat surface having no embossment.

The embossment of the n-type layer may be formed through, for example, any of the following processes. In one process, an embossment is formed on a surface of a growth substrate through etching or a similar technique, and the n-type layer is formed on the substrate so as to contour the embossment. When this process is employed, an Si substrate is particularly effectively employed as the growth substrate. In the case of an Si substrate, an embossment can be readily formed through anisotropic wet etching. In addition, an Si substrate itself is inexpensive, and a large-sized Si substrate can be employed. Therefore, when an Si substrate is employed, the Group III nitride semiconductor light-emitting device can be produced at low cost. In another process, a stripe-pattern mask is formed on the growth substrate, and the n-type layer is formed through facet growth, whereby the embossment is formed. Alternatively, the embossment of the n-type layer may be formed through the following procedure: a first n-type layer is formed on the growth substrate so as to be flat; a stripe-pattern mask is formed on the first n-type layer; and a second n-type layer is formed through selective growth on the first n-type layer by means of the mask. Alternatively, the embossment may be formed through dry etching of the n-type layer, followed by formation of an additional n-type layer so as to contour the embossment.

Preferably, the light-emitting layer is formed under reduced pressure. This is because when the light-emitting layer is formed under reduced pressure, the raw material gas employed is prevented from remaining at the bottom of the embossment, and the resultant light-emitting layer has a uniform thickness. In addition, reduced-pressure growth realizes formation of a steep interlayer surface. When the raw material gas is caused to flow in one direction, in some cases, the thickness or composition of a portion of the resultant light-emitting layer on the upstream side of gas flow may differ from that of a portion of the layer on the downstream side of gas flow. However, reduced-pressure growth can avoid such a problem.

A second aspect of the present invention is drawn to a specific embodiment of the method for producing a Group III nitride semiconductor light-emitting device according to the first aspect of the invention, wherein MOCVD is carried out under reduced pressure.

A third aspect of the present invention is drawn to a specific embodiment of the method for producing a Group III nitride semiconductor light-emitting device according to the first or second aspect of the invention, wherein the embossment has a serrated cross section in a direction perpendicular to the direction of the stripe.

A fourth aspect of the present invention is drawn to a specific embodiment of the method for producing a Group III nitride semiconductor light-emitting device according to any of the first to third aspects of the invention, wherein the entire upper surface that forms the embossment having a serrated cross section assumes a (11-22) plane.

A fifth aspect of the present invention is drawn to a specific embodiment of the method for producing a Group III nitride semiconductor light-emitting device according to any of the first to fourth aspects of the invention, wherein the n-type layer is formed on a substrate having a stripe-pattern embossment so as to contour the embossment.

A sixth aspect of the present invention is drawn to a specific embodiment of the method for producing a Group III nitride semiconductor light-emitting device according to the fifth aspect of the invention, wherein the substrate is an Si substrate; and the embossment is formed by forming a stripe-pattern mask on a surface of the Si substrate, and then subjecting the surface to anisotropic wet etching.

A seventh aspect of the present invention is drawn to a specific embodiment of the method for producing a Group III nitride semiconductor light-emitting device according to any of the first to fourth aspects of the invention, wherein the n-type layer includes a first n-type layer and a second n-type layer; the first n-type layer is formed on a substrate; a stripe-pattern mask is formed on the first n-type layer; and the second n-type layer is formed through selective growth on the first n-type layer by means of the stripe-pattern mask, so that the second n-type layer has the embossment on a surface thereof.

According to the first aspect, since a stripe-pattern embossment is formed on an n-type layer, and a raw material gas is caused to flow in the direction of the stripe, the flow rate of the raw material gas and the direction of gas flow become stable, and thus a light-emitting layer having a uniform thickness can be formed so as to contour the embossment. Therefore, the thus-produced Group III nitride semiconductor light-emitting device exhibits high light output and reduced driving voltage.

According to the second aspect, since the raw material gas can be prevented from remaining at the bottom of the embossment, the resultant light-emitting layer has more uniform thickness and composition. Also, a steep interlayer surface can be formed.

As described in the third aspect, when the stripe-pattern embossment has a serrated cross section, emission area can be further increased, and light output can be further improved.

As described in the fourth aspect, when the entire upper surface that forms the embossment having a serrated cross section assumes a (11-22) plane, the effect of internal electric field can be greatly reduced, and internal quantum efficiency can be improved. Therefore, light output can be further improved.

As described in the fifth aspect, when a substrate having an embossment is employed, an n-type layer having the corresponding embossment can be readily formed thereon. Also, the embossment of the substrate realizes improvement of light extraction performance. Particularly, as described in the sixth aspect, when an Si substrate is employed, an embossment is readily formed on the substrate.

As described in the seventh aspect, when a second n-type layer is formed through selective growth on a first n-type layer by means of a mask, an n-type layer having an embossment can be readily formed, so that inclined surfaces of the embossment are (11-22)-plane surfaces.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which:

FIG. 3 shows the configuration of a light-emitting device 200 according to Embodiment 2;and FIGS. 4A to 4D are sketches showing processes for producing the light-emitting device 200 according to Embodiment 2.

DETAILED DESCRIPTION OF PREFERRED EMBODIMENTS

Specific embodiments of the present invention will next be described with reference to the drawings. However, the present invention is not limited to the embodiments.

Embodiment 1

Figure 1:
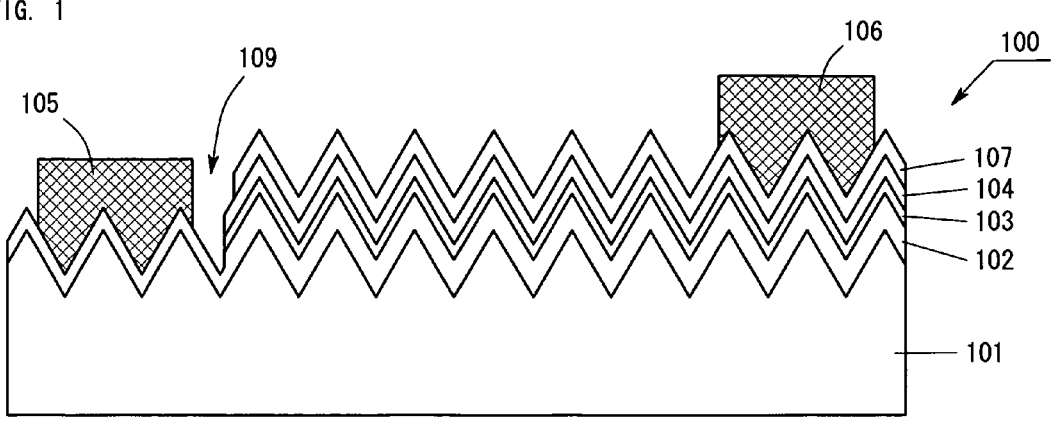
FIG. 1 shows the configuration of a light-emitting device 100 according to Embodiment 1.

FIG. 1 shows the configuration of a light-emitting device 100 according to Embodiment 1. The light-emitting device 100 includes a substrate 101; an n-type layer 102, a light-emitting layer 103, and a p-type layer 104, which are sequentially deposited on the substrate 101; an n-electrode 105; a p-electrode 106; and a transparent electrode 107.

The substrate 101 has a stripe-pattern embossment on the surface on the side of the n-type layer 102. The embossment has a serrated cross section in a direction perpendicular to the direction of the stripe.

The substrate 101 may be formed of any conventionally known material for forming a growth substrate for a Group III nitride semiconductor; for example, sapphire, Si, SiC, ZnO, or spinel. When the substrate 101 is formed of a light-absorbing material such as Si, preferably, a light reflection layer (e.g., an optical multilayer film, a DBR layer, or a metal layer) is provided between the substrate 101 and the n-type layer 102, so as to form a structure for improving light extraction performance.

On the surface of the substrate 101 on the side of the embossment are sequentially deposited, via a non-illustrated buffer layer, the n-type layer 102, the light-emitting layer 103, and the p-type layer 104, each of the layers 102 to 104 being formed of a Group III nitride semiconductor layer having a c-plane main surface. Each of the n-type layer 102, the light-emitting layer 103, and the p-type layer 104 is formed so as to contour the embossment of the substrate 101 (i.e., each layer has a stripe-pattern and a serrated cross section), and each layer has uniform thickness and composition in an in-plane direction.

Each of the n-type layer 102, the light-emitting layer 103, and the p-type layer 104 may have any conventionally known structure. The n-type layer 102 has, for example, a structure in which an n-type contact layer formed of GaN and doped with Si at high concentration and an n-cladding layer formed of GaN are sequentially deposited on the substrate 101. The light-emitting layer 103 has, for example, an MQW structure in which GaN barrier layers and InGaN well layers are alternately deposited repeatedly. The p-type layer 104 has, for example, a structure in which a p-cladding layer formed of AlGaN and doped with Mg and a p-contact layer formed of GaN and doped with Mg are sequentially deposited on the light-emitting layer 103.

A groove 109 having a depth reaching the n-type layer 102 is formed in a region of the p-type layer 104 through dry etching. The bottom of the groove 109 has a stripe pattern and a serrated cross section so as to contour the embossment of the substrate. The n-electrode 105 is formed on a portion of the n-type layer 102 exposed at the bottom of the groove 109. The transparent electrode 107 is formed so as to cover almost the entire top surface of the p-type layer 104, and the p-electrode 106 is formed on the transparent electrode 107.

So long as the embossment has a stripe pattern, it does not necessarily have a serrated cross section in a direction perpendicular to the stripe direction. However, preferably, the stripe-pattern embossment has such a shape that the area of surfaces parallel with the main surface of the device is as small as possible, from the viewpoint of further increase in emission area. Most preferably, the embossment has such a shape that it does not have surfaces parallel with the main surface of the device (i.e., the embossment has a serrated cross section). Particularly preferably, all inclined surfaces of the light-emitting layer 103 having such a serrated cross section are (11-22)-plane surfaces. (11-22) plane is inclined by about 60° with respect to c-plane and is a semi-polar plane. Therefore, when the light-emitting layer 103 is formed so as to have (11-22)-plane surfaces, internal quantum efficiency can be improved.

Although the light-emitting device 100 according to Embodiment 1 has a face-up-type structure, the light-emitting device 100 may have a flip-chip-type structure in which the transparent electrode 107 is omitted, and the p-electrode 106 is formed of a highly reflective material (e.g., an Ag alloy) so as to cover the entire top surface of the p-type layer 104.

The light-emitting device 100 has a large emission area, since the light-emitting layer 103 is formed so as to have a serrated cross section. Since the light-emitting layer 103 has uniform thickness and composition, current is distributed uniformly, and emission performance is improved. In addition, since the substrate 101 has an embossment, light extraction performance is also improved. For these reasons, the light-emitting device 100 exhibits improved light output. Each of the n-electrode 105, the p-electrode 106, and the transparent electrode 107 is in contact with the corresponding layer in a large area so as to contour the embossment. Therefore, driving voltage is reduced.

Next will be described processes for producing the light-emitting device 100 according to Embodiment 1 with reference to FIG. 2.

Figure 2A:
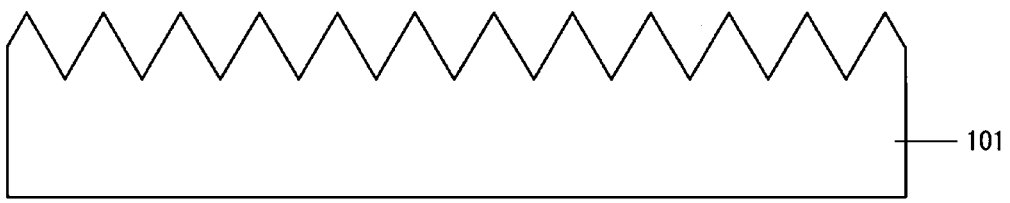
FIGS. 2A to 2C are sketches showing processes for producing the light-emitting device 100 according to Embodiment 1.

Firstly, a stripe-pattern embossment having a serrated cross section is formed on one surface of the substrate 101 (FIG. 2A). The embossment may be formed by forming a stripe-pattern mask on the surface of the substrate 101, followed by dry etching. When the substrate 101 is an Si substrate, the embossment may be formed through wet etching. Since an Si substrate may be subjected to anisotropic wet etching with a solution of a strong alkali such as KOH or TMAH (tetramethylammonium hydroxide), the embossment having a serrated cross section may be readily formed through such wet etching. For example, the stripe-pattern embossment having a serrated cross section may be readily formed on a surface of an Si substrate having a (100)-plane main surface by forming a stripe-pattern mask on the surface of the Si substrate, followed by wet etching with, for example, KOH or TMAH. Inclined surfaces forming the embossment having a serrated cross section are (111)-plane surfaces and are suitable for growth of a Group III nitride semiconductor. Since an Si substrate is less expensive than, for example, a sapphire substrate (i.e., a large-sized Si substrate can be employed), production cost can be reduced.

Figure 2B:
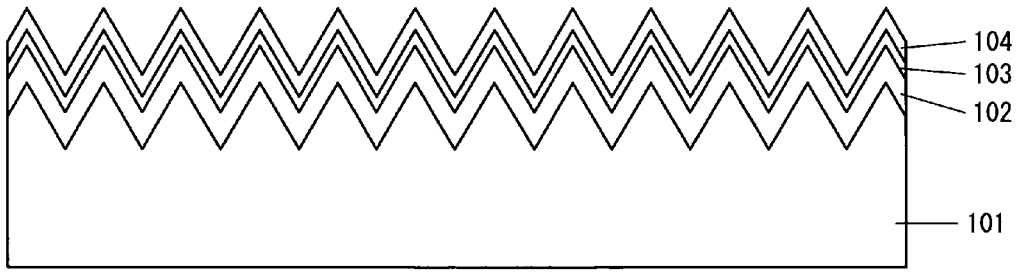

Subsequently, on the surface of the substrate 101 on the side of the stripe-pattern embossment having a serrated cross section, the buffer layer (non-illustrated), the n-type layer 102, the light-emitting layer 103, and the p-type layer 104 are sequentially deposited through reduced-pressure MOCVD so as to contour the embossment. Thus, each of the layers is formed so as to contour the embossment, and to have a stripe pattern with a serrated cross section (FIG. 2B). The raw material gases employed for MOCVD are as follows: ammonia ($NH_3$) as a nitrogen source, trimethylgallium ($Ga(CH_3)_3$) as a Ga source, trimethylindium ($In(CH_3)_3$) as an In source, and trimethylaluminum ($Al(CH_3)_3$) as an Al source. Silane ($SiH_4$) is employed as an n-type doping gas, and cyclopentadienylmagnesium ($Mg(C_5H_5)_2$) is employed as a p-type doping gas. $H_2$ and $N_2$ are employed as carrier gases.

In the aforementioned MOCVD process for forming the n-type layer 102, the light-emitting layer 103, and the p-type layer 104, the direction of gas flow is parallel with the direction of the stripe of the embossment. Thus, each of the layers has uniform thickness and composition along the embossment, and a steep interlayer surface can be formed. Since the n-type layer 102, the light-emitting layer 103, and the p-type layer 104 are grown under reduced pressure, gases employed can be prevented from remaining at the bottom of the embossment. In addition, such reduced-pressure growth can reduce the difference in thickness or composition in an in-plane direction between a portion of the grown layer on the upstream side of gas flow and a portion of the grown layer on the downstream side of gas flow.

The direction of gas flow is not necessarily completely identical to a direction parallel with the direction of the stripe of the embossment. The direction of gas flow may be deflected from the stripe direction, so long as the direction of gas flow is not perpendicular to the stripe direction. When the direction of gas flow is perpendicular to the stripe direction, disturbed flow may occur in the vicinity of the surface of a semiconductor crystal, which results in an increase in non-uniformity of the thickness of a diffusion layer present in the vicinity of the surface of the semiconductor crystal, leading to an increase in non-uniformity of the thickness or composition of the resultant layer in an in-plane direction. The direction of gas flow may be controlled by, for example, rotating the wafer in a plane parallel with the wafer so that the direction of gas flow is identical to the stripe direction. Preferably, the angle of deflection of gas flow is controlled so as to fall within a range of −30° to 30° with respect to a direction parallel with the direction of the stripe of the embossment, so that the n-type layer 102, the light-emitting layer 103, and the p-type layer 104 have more uniform thickness and composition.

Figure 2C:
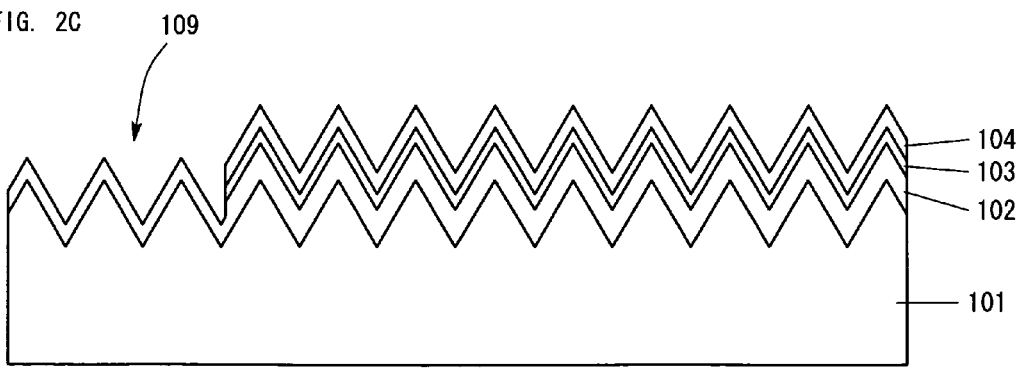

Subsequently, a mask having an opening is formed on the p-type layer 104, and the groove 109 having a depth reaching the n-type layer 102 is formed through dry etching from the top surface of the p-type layer 104. As described above, the p-type layer 104 has an embossment on its surface, and the p-type layer 104, the light-emitting layer 103, and the n-type layer 102 are etched to have a uniform depth in an in-plane direction. Therefore, the n-type layer 102 exposed at the bottom of the groove 109 also has an embossment. Thereafter, the mask employed for dry etching is removed (FIG. 2C).

Next, the transparent electrode 107 is formed so as to cover the entire top surface of the p-type layer 104; the n-electrode 105 is formed on the n-type layer 102 exposed at the bottom of the groove 109; and the p-electrode 106 is formed on the transparent electrode 107. Since an embossment is formed at the bottom of the groove 109 and the top surface of the p-type layer 104, the n-electrode 105 and the transparent electrode 107 are respectively in contact with the corresponding layers in a large area. Therefore, the n-electrode 105 and the transparent electrode 107 exhibit low contact resistance, and thus the light-emitting device 100 exhibits reduced driving voltage.

The thus-produced light-emitting device 100 exhibits improved emission performance, since the light-emitting layer 103 has uniform thickness and composition, and current is uniformly distributed therethrough.

Embodiment 2

FIG. 3 shows the configuration of a light-emitting device 200 according to Embodiment 2. The light-emitting device 200 includes a substrate 201; an n-type layer 202, a light-emitting layer 203, and a p-type layer 204, which are sequentially deposited on the substrate 201, and each of which is formed of a Group III nitride semiconductor layer having a c-plane main surface; an n-electrode 205; a p-electrode 206; and a transparent electrode 207.

Unlike the case of the substrate 101 described in Embodiment 1, the substrate 201 has a flat surface (i.e., no embossment) on the side of the n-type layer 202.

The n-type layer 202 includes a first n-type layer 202a formed on the substrate 201, and a second n-type layer 202b formed on the first n-type layer. A stripe-pattern mask 208 is formed on the surface of the first n-type layer 202a on the side of the second n-type layer 202b; i.e., the mask 208 is provided in the vicinity of the interface between the first n-type layer 202a and the second n-type layer 202b. The second n-type layer 202b is formed through selective growth on the first n-type layer 202a by means of the mask 208. The second n-type layer 202b has, on the surface on the side opposite the side of the first n-type layer 202a, a stripe-pattern embossment having a serrated cross section formed through facet growth. All inclined surfaces forming the embossment having a serrated cross section are (11-22)-plane surfaces. The mask 208 may be formed of any material which prevents growth of a Group III nitride semiconductor; for example, $SiO_2$.

The light-emitting layer 203 and the p-type layer 204 are sequentially formed on the surface of the second n-type layer 202b on the side of the embossment. Each of the layers 203 and 204 is formed so as to contour the embossment (i.e., each layer has a stripe-pattern and a serrated cross section), and each layer has uniform thickness and composition in an in-plane direction.

A groove having a depth reaching the second n-type layer 202b is formed in a region of the p-type layer 204 through dry etching. The bottom of the groove also has a stripe pattern and a serrated cross section. The n-electrode 205 is formed on a portion of the second n-type layer 202b exposed through the bottom of the groove. The transparent electrode 207 is formed so as to cover almost the entire top surface of the p-type layer 204, and the p-electrode 206 is formed on the transparent electrode 207.

As in the case of the light-emitting device 100 according to Embodiment 1, the light-emitting device 200 according to Embodiment 2 has a large emission area and exhibits improved light output, since the light-emitting layer 203 is formed so as to contour the embossment. Also, since the light-emitting layer 203 is formed along (11-22)-plane surfaces (i.e., semi-polar plane surfaces), the light-emitting device 200 exhibits high internal quantum efficiency. Each of the n-electrode 205, the p-electrode 206, and the transparent electrode 207 is in contact with the corresponding layer in a large area so as to contour the embossment. Therefore, driving voltage is reduced.

Next will be described processes for producing the light-emitting device 200 with reference to FIG. 4.

Firstly, the buffer layer (non-illustrated) and the first n-type layer 202a are formed on the substrate 201 through MOCVD.

Subsequently, the stripe-pattern mask 208 is formed on the first n-type layer 202a, and the second n-type layer 202b is formed through selective growth on the first n-type layer 202a by means of the mask 208. Growth conditions (e.g., temperature) are determined so that facets are (11-22) plane. At an initial stage of growth, n-GaN crystals 210 each having an isosceles triangular cross section are grown on unmasked regions of the first n-type layer 202a so that the grown crystals form a stripe pattern (FIG. 4B). The two inclined surfaces of each crystal having an isosceles triangular cross section are (11-22)-plane surfaces. Then, the n-GaN crystals 210 are grown so as to cover the mask 208 while (11-22)-plane surfaces are maintained, and adjacent n-GaN crystals 210 are combined together, to thereby form the second n-type layer 202b on the first n-type layer 202a and the mask 208. Thus, through selective growth by means of the mask 208, the second n-type layer 202b is formed to have, on the surface on the side opposite the side of the first n-type layer 202a, a stripe-pattern embossment having a serrated cross section such that inclined surfaces of the embossment are (11-22)-plane surfaces (FIG. 4C).

Next, on the surface of the second n-type layer 202b on the side of the stripe-pattern embossment having a serrated cross section, the light-emitting layer 203 and the p-type layer 204 are sequentially deposited through reduced-pressure MOCVD so as to contour the embossment. Thus, the light-emitting layer 203 and the p-type layer 204 are formed so as to contour the embossment, and to have a stripe pattern with a serrated cross section (FIG. 4D). In this MOCVD process, the direction of gas flow is parallel with the direction of the stripe of the embossment. Thus, each of the light-emitting layer 203 and the p-type layer 204 has uniform thickness and composition along the embossment, and a steep interlayer surface can be formed. Since the light-emitting layer 203 and the p-type layer 204 are grown under reduced pressure, gases employed can be prevented from remaining at the bottom of the embossment (corresponding to gullets of the serrated cross section). In addition, such reduced-pressure growth can reduce the difference in thickness or composition in an in-plane direction between a portion of the grown layer on the upstream side of gas flow and a portion of the grown layer on the downstream side of gas flow.

Subsequently, a portion of the p-type layer 204 is subjected to dry etching, to thereby form a groove having a depth reaching the n-type layer 202. The transparent electrode 207 is formed on the p-type layer 204; the n-electrode 205 is formed on the second n-type layer 202b exposed at the bottom of the groove; and the p-electrode 206 is formed on the transparent electrode 207. As in the case of Embodiment 1, since an embossment is formed at the bottom of the groove and the top surface of the p-type layer 204, the n-electrode 205 and the transparent electrode 207 are respectively in contact with the corresponding layers in a large area. Therefore, the n-electrode 205 and the transparent electrode 207 exhibit low contact resistance, and thus the light-emitting device 200 exhibits reduced driving voltage.

The thus-produced light-emitting device 200 exhibits improved emission performance, since the light-emitting layer 203 has uniform thickness and composition, and current is uniformly distributed therethrough. In addition, since the light-emitting layer 203 can be formed along (11-22)-plane surfaces (i.e., semi-polar plane surfaces), internal quantum efficiency can be improved.

Regarding formation of a stripe-pattern embossment on an n-type layer, Embodiment 1 describes the method in which a substrate is processed to have a stripe-pattern embossment, and the n-type layer is grown on the substrate so as to contour the embossment. Meanwhile, Embodiment 2 describes the method for forming a stripe-pattern embossment on a surface of a second n-type layer, in which a stripe-pattern mask is formed on a first n-type layer, and the second n-type layer is formed through selective growth on the first n-type layer. However, formation of a stripe-pattern embossment on an n-type layer may be carried out through another method; for example, a method in which a stripe-pattern mask is formed on a substrate, and an n-type layer is formed through selective growth on the substrate, to thereby form a stripe-pattern embossment on a surface of the n-type layer; or a method in which a flat n-type layer is processed directly by dry etching or a similar technique, to thereby form an embossment on the n-type layer, and another n-type layer is grown thereon so as to contour the embossment.

The light-emitting devices according to the aforementioned embodiments have a structure in which the n-electrode and the p-electrode are on the same side of the device. However, the present invention is applicable to a light-emitting device having a vertical-type structure. In a vertical-type light-emitting device, an n-electrode is provided so as to face a p-electrode, and electrical conduction is achieved in a direction perpendicular to the main surface of the device. Such a vertical-type light-emitting device may be produced through a method employing, as a growth substrate, an Si substrate, a GaN substrate, or the like (i.e., substrate of conductive material). Also, the vertical-type light-emitting device may be produced, in which a p-contact electrode is formed on a p-type layer after the respective layers are deposited on the growth substrate, and then the p-electrode is bonded to a conductive support substrate via, for example, a low-melting-point metal layer, followed by removal of the growth substrate through the laser lift-off process, etching, or a similar technique.

The Group III nitride semiconductor light-emitting device of the present invention can be employed in, for example, an illumination apparatus.

What is claimed is:

1. A method for producing a Group III nitride semiconductor light-emitting device, the method comprising forming an n-type layer from a Group III nitride semiconductor so as to have a stripe-pattern embossment on a surface thereof; and forming, through MOCVD, a light-emitting layer from a Group III nitride semiconductor on the embossed surface of the n-type layer so as to contour the embossment, wherein the light-emitting layer is formed by causing a raw material gas to flow in a direction parallel with the direction of the stripe.

2. A method for producing a Group III nitride semiconductor light-emitting device according to claim 1, wherein MOCVD is carried out under reduced pressure.

3. A method for producing a Group III nitride semiconductor light-emitting device according to claim 2, wherein the embossment has a serrated cross section in a direction perpendicular to the direction of the stripe.

4. A method for producing a Group III nitride semiconductor light-emitting device according to claim 3, wherein the entire upper surface that forms the embossment having a serrated cross section assumes a (11-22) plane.

5. A method for producing a Group III nitride semiconductor light-emitting device according to claim 1, wherein the embossment has a serrated cross section in a direction perpendicular to the direction of the stripe.

6. A method for producing a Group III nitride semiconductor light-emitting device according to claim 5, wherein the entire upper surface that forms the embossment having a serrated cross section assumes a (11-22) plane.

7. A method for producing a Group III nitride semiconductor light-emitting device according to claim 6, wherein the n-type layer is formed on a substrate having a stripe-pattern embossment so as to contour the embossment.

8. A method for producing a Group III nitride semiconductor light-emitting device according to claim 7, wherein the substrate is an Si substrate; and the embossment is formed by forming a stripe-pattern mask on a surface of the Si substrate, and then subjecting the surface to anisotropic wet etching.

9. A method for producing a Group III nitride semiconductor light-emitting device according to claim 6, wherein the n-type layer includes a first n-type layer and a second n-type layer; the first n-type layer is formed on a substrate; a stripe-pattern mask is formed on the first type layer; and the second n-type layer is formed through selective growth on the first n-type layer by means of the stripe-pattern mask, so that the second n-type layer has the embossment on a surface thereof.

10. A method for producing a Group III nitride semiconductor light-emitting device according to claim 5, wherein the n-type layer is formed on a substrate having a stripe-pattern embossment so as to contour the embossment.

11. A method for producing a Group III nitride semiconductor light-emitting device according to claim 10, wherein the substrate is an Si substrate; and the embossment is formed by forming a stripe-pattern mask on a surface of the Si substrate, and then subjecting the surface to anisotropic wet etching.

12. A method for producing a Group III nitride semiconductor light-emitting device according to claim 5, wherein the n-type layer includes a first n-type layer and a second n-type layer; the first n-type layer is formed on a substrate; a stripe-pattern mask is formed on the first n-type layer; and the second n-type layer is formed through selective growth on the first n-type layer by means of the stripe-pattern mask, so that the second n-type layer has the embossment on a surface thereof.

13. A method for producing a Group III nitride semiconductor light-emitting device according to claim 1, wherein the n-type layer is formed on a substrate having a stripe-pattern embossment so as to contour the embossment.

14. A method for producing a Group III nitride semiconductor light-emitting device according to claim 13, wherein the substrate is an Si substrate; and the embossment is formed by forming a stripe-pattern mask on a surface of the Si substrate, and then subjecting the surface to anisotropic wet etching.

15. A method for producing a Group III nitride semiconductor light-emitting device according to claim 1, wherein the n-type layer includes a first n-type layer and a second n-type layer; the first n-type layer is formed on a substrate; a stripe-pattern mask is formed on the first n-type layer; and the second n-type layer is formed through selective growth on the first n-type layer by means of the stripe-pattern mask, so that the second n-type layer has the embossment on a surface thereof.

* * * * *